United States Patent
Choi et al.

(10) Patent No.: US 7,397,281 B2
(45) Date of Patent: Jul. 8, 2008

(54) INPUT/OUTPUT CIRCUIT OF SEMICONDUCTOR MEMORY DEVICE AND INPUT/OUTPUT METHOD THEREOF

(75) Inventors: Jong-Hyun Choi, Gyeonggi-do (KR); Young-Hun Seo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 42 days.

(21) Appl. No.: 11/348,582

(22) Filed: Feb. 6, 2006

(65) Prior Publication Data
US 2006/0176079 A1    Aug. 10, 2006

(30) Foreign Application Priority Data
Feb. 4, 2005    (KR)    ............ 10-2005-0010659

(51) Int. Cl.
*H03K 19/0175*    (2006.01)
(52) U.S. Cl. ............... 326/81; 326/86; 326/58
(58) Field of Classification Search ............ 326/56–58, 326/86
See application file for complete search history.

(56) References Cited

U.S. PATENT DOCUMENTS

| | | | | |
|---|---|---|---|---|
| 5,055,713 | A * | 10/1991 | Watanabe et al. ............ | 326/27 |
| 5,576,635 | A * | 11/1996 | Partovi et al. ............ | 326/27 |
| 5,646,553 | A * | 7/1997 | Mitchell et al. ............ | 326/86 |
| 5,880,602 | A * | 3/1999 | Kaminaga et al. ............ | 326/81 |
| 5,929,654 | A * | 7/1999 | Park et al. ............ | 326/58 |
| 5,990,705 | A * | 11/1999 | Lim ............ | 326/81 |
| 6,060,906 | A * | 5/2000 | Chow et al. ............ | 326/81 |
| 6,201,743 | B1 * | 3/2001 | Kuroki ............ | 365/194 |
| 6,236,235 | B1 * | 5/2001 | Arai et al. ............ | 326/81 |
| 6,272,577 | B1 * | 8/2001 | Leung et al. ............ | 710/110 |
| 6,329,835 | B1 * | 12/2001 | Chen ............ | 326/27 |
| 6,448,812 | B1 * | 9/2002 | Bacigalupo ............ | 326/83 |
| 6,803,789 | B1 * | 10/2004 | Yu et al. ............ | 326/81 |

FOREIGN PATENT DOCUMENTS

| | | |
|---|---|---|
| JP | 05-035378 | 2/1993 |
| JP | 2003-139823 | 5/2003 |
| KR | 1999-50810 | 7/1999 |

OTHER PUBLICATIONS

English language abstract of Korean Publication No. 1999-50810.
English language abstract of Japanese Publication No. 05-035378.
English language abstract of Japanese Publication No. 2003-139823.

* cited by examiner

*Primary Examiner*—Vibol Tan
(74) *Attorney, Agent, or Firm*—Marger Johnson & McCollom, P.C.

(57) ABSTRACT

An input/output circuit for a semiconductor memory device, including a data output circuit configured to buffer output data in the semiconductor memory device in response to an input/output enable signal to output the buffered output data to an input/output signal line, a data input circuit configured to receive input data from the input/output signal line and buffer the input data to transfer the buffered input data to the semiconductor memory device, and a load controller configured to control a load on the input/output signal line in response to the input/output enable signal.

18 Claims, 4 Drawing Sheets

INPUT/OUTPUT CIRCUIT OF SEMICONDUCTOR MEMORY DEVICE AND INPUT/OUTPUT METHOD THEREOF

CLAIM FOR PRIORITY

This application claims priority to Korean Patent Application No. 2005-10659 filed on Feb. 4, 2005 in the Korean Intellectual Property Office, the entire contents of which are hereby incorporated by reference.

BACKGROUND OF THE INVENTION

1. Field of the Invention

This disclosure relates to an input/output circuit of a semiconductor memory device and an input/output method for a semiconductor memory device. More particularly, this disclosure relates to an input/output circuit of a semiconductor memory device that may control a load of the input/output path when data are input or output from a semiconductor memory device and an input/output method for such a semiconductor device.

2. Description of the Related Art

Semiconductor memory devices used for electronic products have become highly integrated, and data transmission speeds have been improved.

As operating frequencies of the semiconductor memory device have become higher, a method of controlling load of an input/output path has been an important factor in the design of the semiconductor memory devices since the load of an input/output path may affect integrity of transferred signals.

Accordingly, there has been a requirement for an input/output circuit that is capable of controlling the load of the input/output path of the semiconductor memory device.

SUMMARY OF THE INVENTION

An embodiment includes an input/output circuit for a semiconductor memory device, including a data output circuit configured to buffer output data in the semiconductor memory device in response to an input/output enable signal to output the buffered output data to an input/output signal line, a data input circuit configured to receive input data from the input/output signal line and buffer the input data to transfer the buffered input data to the semiconductor memory device, and a load controller configured to control a load on the input/output signal line in response to the input/output enable signal.

A further embodiment includes an input/output method of a semiconductor memory device including buffering output data in the semiconductor memory device in response to an input/output enable signal to output the buffered output data to an input/output signal line, receiving input data from the input/output signal line and buffering the input data to transfer the buffered input data to the semiconductor memory device, and controlling a load of the input/output signal line in response to the input/output enable signal.

BRIEF DESCRIPTION OF THE DRAWINGS

The above and other features and advantages of the invention will become more apparent when embodiments are described in detailed with reference to the attached drawings in which.

DESCRIPTION OF THE EMBODIMENTS

Figure 1:
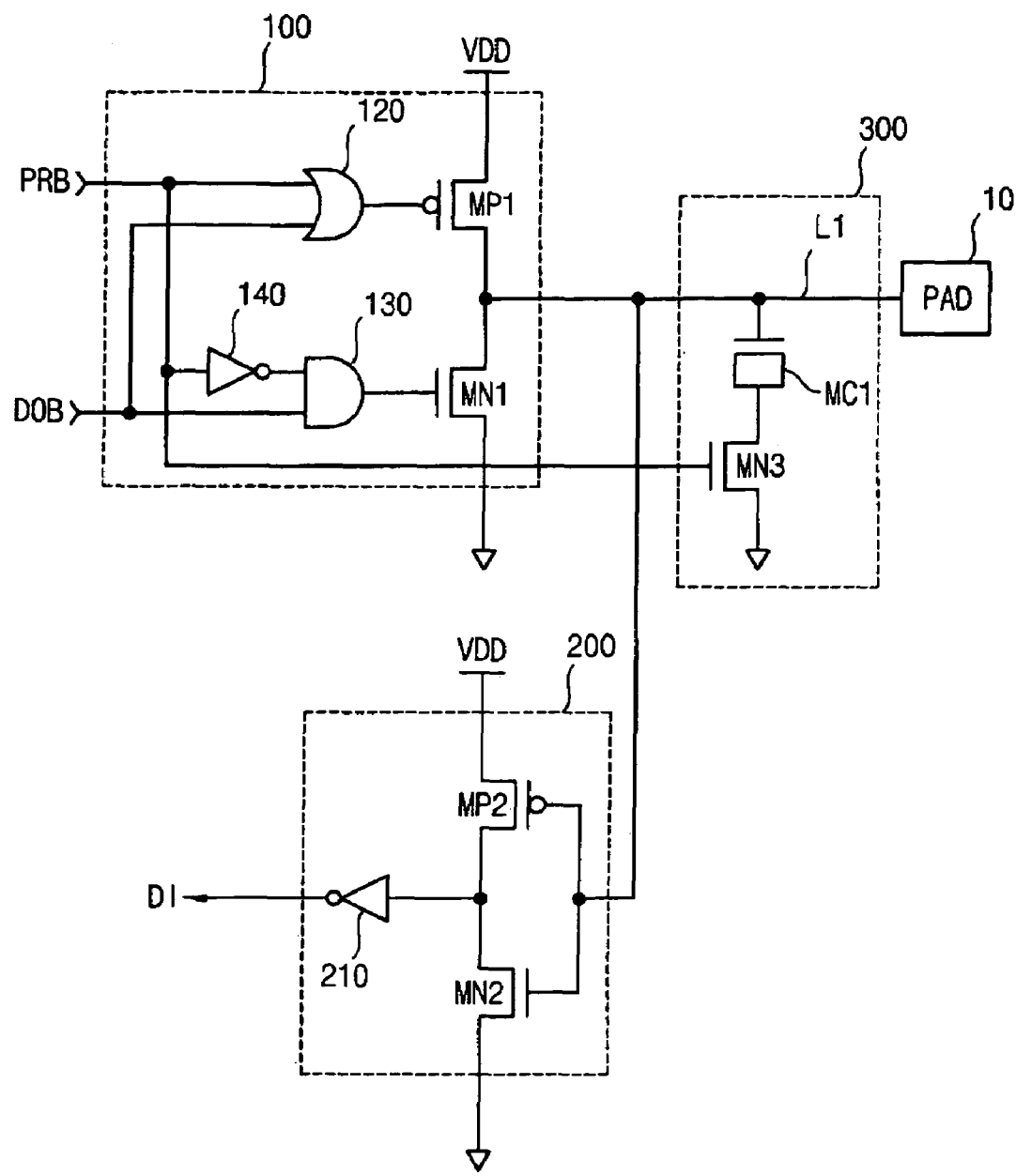
FIG. 1 is a circuit diagram illustrating an input/output circuit of a semiconductor memory device according to an example embodiment.

Detailed illustrative embodiments are disclosed herein. However, specific structural and functional details disclosed herein are merely representative for purposes of describing the embodiments. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will be described in detail. It should be understood, however, that there is no intent to limit the invention to the particular forms disclosed, but, on the contrary, the invention is to cover all modifications, equivalents, and alternatives falling within the spirit and scope of the invention. Like numbers refer to like elements throughout the description of the figures.

It will be understood that, although the terms first, second, etc. may be used to describe various elements, these elements should not be limited by these terms. These terms are only used to distinguish one element from another. For example, a first element could be termed a second element, and, similarly, a second element could be termed a first element, without departing from the scope of the invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram illustrating an input/output circuit of a semiconductor memory device according to an example embodiment.

Referring to FIG. 1, the input/output circuit of the semiconductor memory device includes a data output circuit 100, a data input circuit 200, a pad 10 and a load controller 300.

The data output circuit 100 buffers output data DOB in the semiconductor memory device in response to an input/output enable signal PRB to output the buffered output data to an input/output signal line L1. The input/output signal line L1 is coupled to the pad 10.

The data input circuit 200 receives input data from the input/output signal line L1 and buffers the input data to transfer the buffered input data to the semiconductor memory device.

The load controller 300 controls a load of the input/output signal line L1 in response to the input/output enable signal PRB.

The data output circuit 100 includes an OR gate 120, an inverter 140, an AND gate 130, a PMOS transistor MP1, and an NMOS transistor MN1.

The OR gate 120 performs a logical OR operation on the input/output enable signal PRB and the output data DOB. The inverter 140 inverts the input/output enable signal PRB. The AND gate 130 performs a logical AND operation on an output signal of the inverter 140, i.e., the inverted signal of the input/output enable signal PRB and the output data DOB. The PMOS transistor MP1 has a gate to which an output signal of the OR gate 120 is applied; a source coupled to a high power voltage VDD and a drain coupled to the input/output signal line L1. The NMOS transistor MN1 has a gate to which an output signal of the AND gate 130 is applied; a source coupled to a low power voltage and a drain coupled to the input/output signal line L1.

The data input circuit 200 includes a PMOS transistor MP2, an NMOS transistor MN2 and an inverter 210.

The PMOS transistor MP2 has a gate to receive the input data from the input/output signal line L1, and a source coupled to the high power voltage VDD. The NMOS transistor MN2 has a gate coupled to the gate of the PMOS transistor MP2, a drain coupled to a drain of the PMOS transistor MP2 and a source coupled to the low power voltage. The inverter 210 inverts a voltage at the drain of the NMOS transistor MN2 and generates a memory cell input data DI.

The load controller 300 includes a MOS capacitor MC1 and an NMOS transistor MN3.

The MOS capacitor MC1 has a first terminal coupled to the input/output signal line L1. The NMOS transistor MN3 is coupled between a second terminal of the MOS capacitor MC1 and the low power voltage, and is controlled in response to the input/output enable signal PRB.

Hereinafter, operations of the input/output circuit of the semiconductor memory device according to an example embodiment will be explained with reference to FIG. 1.

When data read from a memory cell array (not shown) are output, the output data DOB are buffered by the data output circuit 100 and the buffered output data are transferred to the pad 10 through the input/output signal line L1. Then, the output data DOB are transferred to other chip sets such as a memory controller (not shown) from the pad 10.

When the input/output enable signal PRB is at a logic 'low' state, the data output from the memory cell array (not shown) are transferred through the pad 10. When the input/output enable signal PRB is at a logic 'high' state, the output signal of the OR gate 120 becomes the logic 'high' state, and the output signal of the AND gate 130 becomes the logic 'low' state. As a result, both the PMOS transistor MP1 and the NMOS transistor MN1 are turned off. That is, when the input/output enable signal PRB is at the logic 'high' state, the output data DOB are not transferred to the pad 10.

When the input/output enable signal PRB is at the logic 'low' state and the output data DOB is at the logic 'high' state, the output signal of the OR gate 120 becomes the logic 'high' state, and the output signal of the AND gate 130 becomes the logic 'high' state.

As a result, the PMOS transistor MP1 is turned off and the NMOS transistor MN1 is turned on. As a result, a voltage level of the input/output signal line L1 becomes the logic 'low' state. That is, the voltage level of the input/output signal line L1 is identical with an inverted voltage level of the output data DOB.

When data are input from an external device to the semiconductor memory device, the input data are provided to the semiconductor memory device from external chip sets through the pad 10. The input data received at the pad 10 are transferred to the data input circuit 200 through the input/output signal line L1. The data input circuit 200 buffers the input data to transfer the buffered input data to the memory cell array (not shown).

The load controller 300 controls the load of the input/output signal line L1 in response to the input/output enable signal PRB. When the input/output enable signal PRB is at the logic 'low' state, i.e., a data read operation is performed, the NMOS transistor MN3 is turned off and the MOS capacitor MC1 does not affect the input/output signal line L1. When the input/output enable signal PRB is at the logic 'high' state, i.e., a data write operation is performed, the NMOS transistor MN3 is turned on and the MOS capacitor MC1 is coupled between the input/output signal line L1 and the low power voltage.

In the input/output circuit of the semiconductor memory device shown in FIG. 1, when the data in the semiconductor memory device are output, the load of the input/output signal line L1 is decreased, and when the data are input from the external devices to the semiconductor memory device, the load of the input/output signal line L1 is increased.

In other words, when the semiconductor memory device receives the data from external devices, integrity of data signals may be improved and waveforms of the data signals may become more clear.

Figure 2:
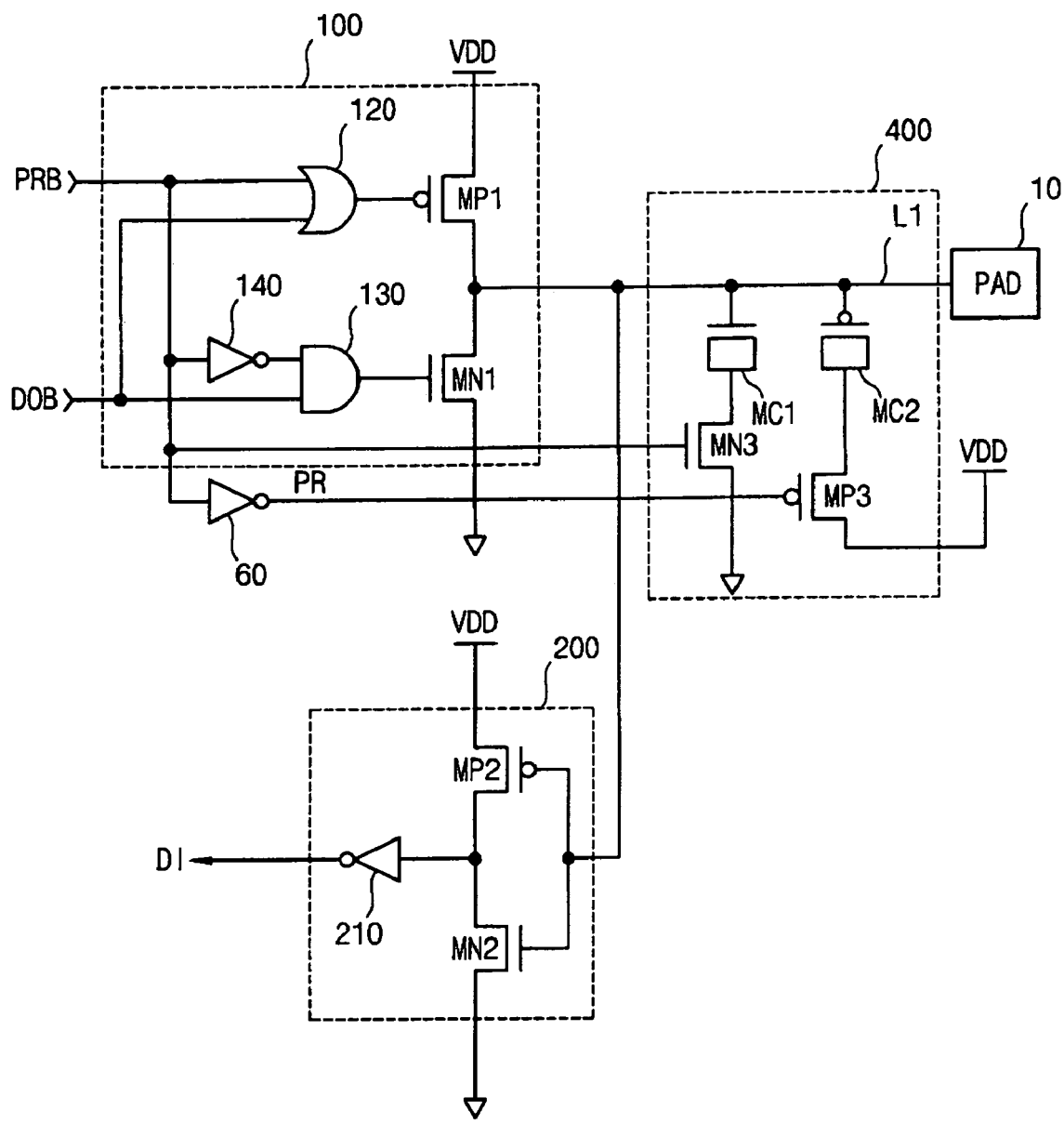
FIG. 2 is a circuit diagram illustrating an input/output circuit of a semiconductor memory device according to another example embodiment.

FIG. 2 is a circuit diagram illustrating an input/output circuit of a semiconductor memory device according to another example embodiment.

Referring to FIG. 2, the input/output circuit of the semiconductor memory device includes a data output circuit 100, a data input circuit 200, an inverter 60, a pad 10 and a load controller 400.

The data output circuit 100 buffers output data DOB in the semiconductor memory device in response to an input/output enable signal PRB to output the buffered output data to an input/output signal line L1. The input/output signal line L1 is coupled to the pad 10.

The data input circuit 200 receives input data from the input/output signal line L1 and buffers the input data to transfer the buffered input data to the semiconductor memory device.

The inverter 60 inverts the input/output enable signal PRB.

The load controller 400 controls a load of the input/output signal line L1 in response to the input/output enable signal PRB and an output signal PR of the inverter 60.

The data output circuit 100 includes an OR gate 120, an inverter 140, an AND gate 130, a PMOS transistor MP1 and an NMOS transistor MN1.

The OR gate 120 performs a logical OR operation on the input/output enable signal PRB and the output data DOB. The inverter 140 inverts the input/output enable signal PRB. The AND gate 130 performs a logical AND operation on an output signal of the inverter 140, i.e., the inverted signal of the input/output enable signal PRB and the output data DOB. The PMOS transistor MP1 has a gate to which an output signal of the OR gate 120 is applied; a source coupled to a high power voltage VDD and a drain coupled to the input/output signal line L1. The NMOS transistor MN1 has a gate to which an output signal of the AND gate 130 is applied; a source coupled to a low power voltage and a drain coupled to the input/output signal line L1.

The data input circuit 200 includes a PMOS transistor MP2, an NMOS transistor MN2 and an inverter 210.

The PMOS transistor MP2 has a gate to receive the input data from the input/output signal line L1, and a source coupled to the high power voltage VDD. The NMOS transistor MN2 has a gate coupled to the gate of the PMOS transistor MP2, a drain coupled to a drain of the PMOS transistor MP2 and a source coupled to the low power voltage. The inverter 210 inverts a voltage at the drain of the NMOS transistor MN2 and generates a memory cell input data DI.

The load controller 400 includes a first MOS capacitor MC1, a second MOS capacitor MC2, an NMOS transistor MN3 and a PMOS transistor MP3.

The first MOS capacitor MC1 has a first terminal coupled to the input/output signal line L1. The NMOS transistor MN3 is coupled between a second terminal of the first MOS capacitor MC1 and the low power voltage, and is controlled in response to the input/output enable signal PRB. The first MOS capacitor MC1 is formed by shorting a source and a drain of an NMOS transistor, and has a capacitance generated between the source and a gate of the NMOS transistor.

The second MOS capacitor MC2 has a first terminal coupled to the input/output signal line L1. The PMOS transistor MP3 is coupled between a second terminal of the second MOS capacitor MC2 and the high power voltage VDD, and is controlled in response to the output signal PR of the inverter 60. The second MOS capacitor MC2 is formed by shorting a source and a drain of a PMOS transistor, and has a capacitance generated between the source and a gate of the PMOS transistor.

Operations of the input/output circuit of the semiconductor memory device according to another example embodiment are similar with those of the input/output circuit of the semiconductor memory device shown in FIG. 1; however, the load controller 400 shown in FIG. 2 is different from the load controller 300 shown in FIG. 1. Accordingly, only the operation of the load controller 400 shown in FIG. 2 will be explained below.

The load controller 400 controls the load of the input/output signal line L1 in response to the input/output enable signal PRB and the output signal PR of the inverter 60.

When the input/output enable signal PRB is at the logic 'low' state, i.e., a data read operation is performed, the NMOS transistor MN3 is turned off and the first MOS capacitor MC1 does not affect the input/output signal line L1. Additionally, when the input/output enable signal PRB is at the logic 'low' state, i.e., the data read operation is performed, the output signal PR of the inverter 60 is at the logic 'high' state; thus, the PMOS transistor MP3 is turned off and the second MOS capacitor MC2 does not affect the input/output signal line L1. When the input/output enable signal PRB is at the logic 'high' state, i.e., a data write operation is performed, the NMOS transistor MN3 is turned on and the first MOS capacitor MC1 is coupled between the input/output signal line L1 and the low power voltage. Additionally, when the input/output enable signal PRB is at the logic 'high' state, i.e., the data write operation is performed, the output signal PR of the inverter 60 is at the logic 'low' state; thus, the PMOS transistor MP3 is turned on and the second MOS capacitor MC2 is coupled to the input/output signal line L1 and the high power voltage VDD.

As shown in FIG. 2, when the load controller 400 having the first MOS capacitor MC1 implemented using an NMOS transistor, and the second MOS capacitor MC2 implemented using a PMOS transistor, is used for the input/output circuit of the semiconductor memory device, the data signals encounter identical capacitance characteristics at a rising edge and a falling edge. Consequently, integrity of data signals may be improved.

In the input/output circuit of the semiconductor memory device shown in FIG. 2, when the data in the semiconductor memory device are output, the load of the input/output signal line L1 is decreased, and when the data are input from the external devices to the semiconductor memory device, the load of the input/output signal line L1 is increased. In other words, when the semiconductor memory device receives the data from external devices, integrity of data signals may be improved and waveforms of the data signals may become more clear.

Figure 3:
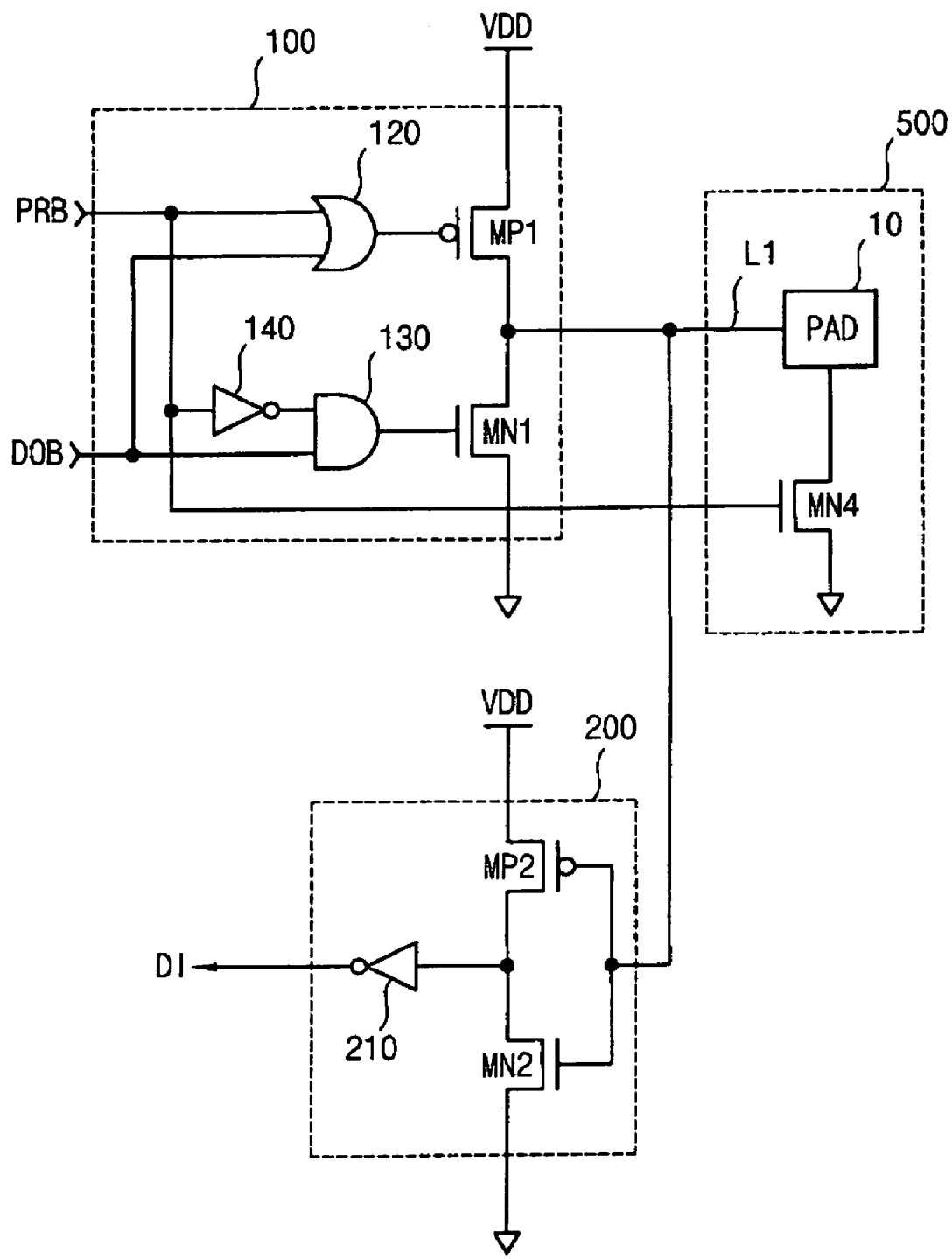
FIG. 3 is a circuit diagram illustrating an input/output circuit of a semiconductor memory device according to still another example embodiment.

FIG. 3 is a circuit diagram illustrating an input/output circuit of a semiconductor memory device according to still another example embodiment.

Referring to FIG. 3, the input/output circuit of the semiconductor memory device includes a data output circuit 100, a data input circuit 200, a pad 10 and a load controller 500.

The data output circuit 100 buffers output data DOB in the semiconductor memory device in response to an input/output enable signal PRB to output the buffered output data to an input/output signal line L1. The input/output signal line L1 is coupled to the pad 10.

The data input circuit 200 receives input data from the input/output signal line L1 and buffers the input data to transfer the buffered input data to the semiconductor memory device.

The load controller 500 controls a load of the input/output signal line L1 in response to the input/output enable signal PRB.

The data output circuit 100 includes an OR gate 120, an inverter 140, an AND gate 130, a PMOS transistor MP1 and an NMOS transistor MN1.

The OR gate 120 performs a logical OR operation on the input/output enable signal PRB and the output data DOB. The inverter 140 inverts the input/output enable signal PRB. The AND gate 130 performs a logical AND operation on an output signal of the inverter 140, i.e., the inverted signal of the input/output enable signal PRB and the output data DOB. The PMOS transistor MP1 has a gate to which an output signal of the OR gate 120 is applied; a source coupled to a high power voltage VDD and a drain coupled to the input/output signal line L1. The NMOS transistor MN1 has a gate to which an output signal of the AND gate 130 is applied; a source coupled to a low power voltage and a drain coupled to the input/output signal line L1.

The data input circuit 200 includes a PMOS transistor MP2, an NMOS transistor MN2 and an inverter 210.

The PMOS transistor MP2 has a gate to receive the input data from the input/output signal line L1, and a source coupled to the high power voltage VDD. The NMOS transistor MN2 has a gate coupled to the gate of the PMOS transistor MP2, a drain coupled to a drain of the PMOS transistor MP2 and a source coupled to the low power voltage. The inverter 210 inverts a voltage at the drain of the NMOS transistor MN2 and generates a memory cell input data DI.

The load controller 500 includes a pad 10 coupled to the input/output signal line L1 and an NMOS transistor MN4. The NMOS transistor MN4 is coupled between the pad 10 and the low power voltage, and is controlled in response to the input/output enable signal PRB.

Figure 4:
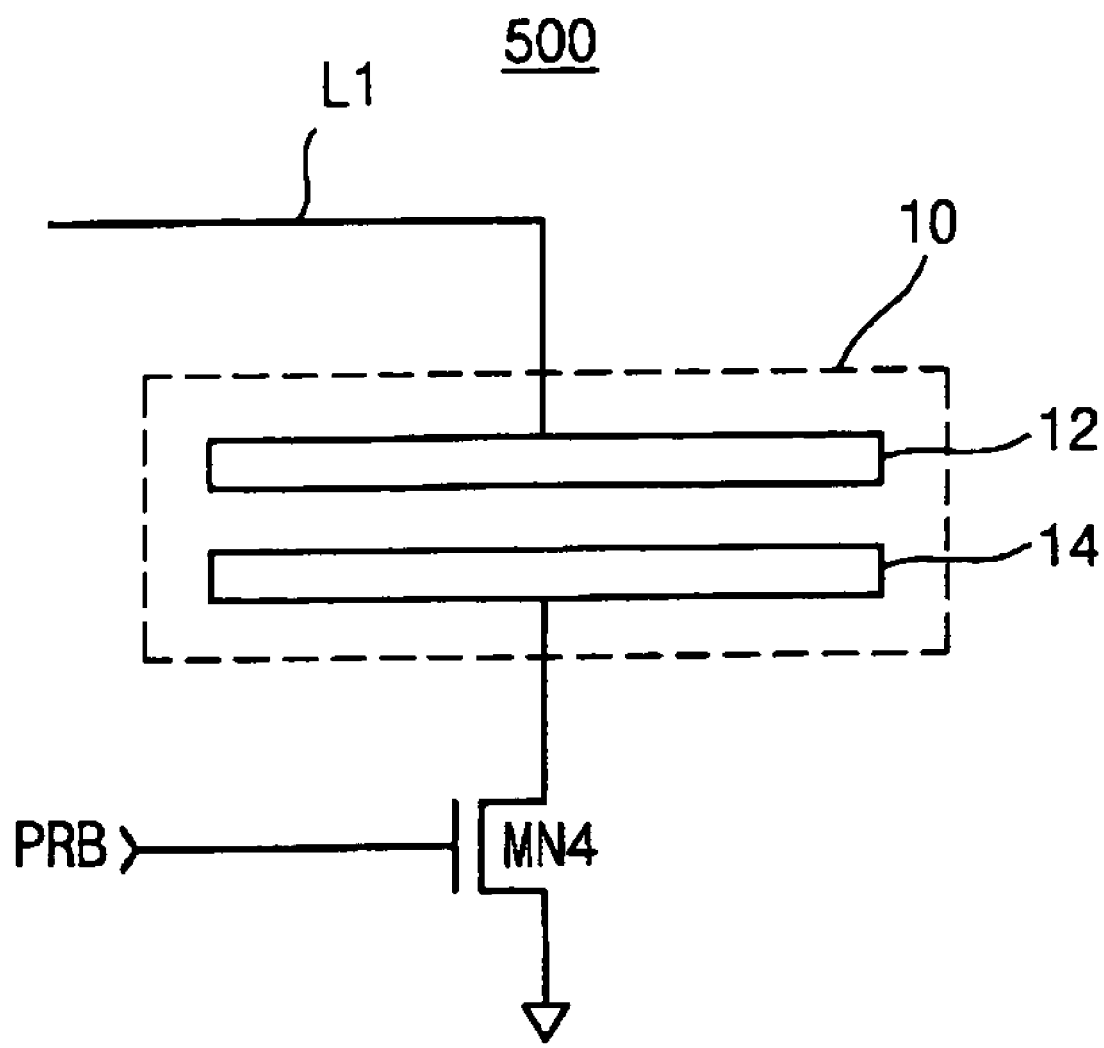
FIG. 4 is a circuit diagram illustrating a load controller included in an input/output circuit shown in FIG. 3.

FIG. 4 is a circuit diagram illustrating a load controller 500 included in an input/output circuit shown in FIG. 3.

Referring to FIG. 4, the load controller 500 includes a pad 10 and an NMOS transistor MN4. The pad 10 includes a first layer 12 and a second layer 14. The first layer 12 is coupled to the input/output signal line L1, and the second layer 14 is coupled to a drain of the NMOS transistor MN4.

Hereinafter, operations of the input/output circuit of the semiconductor memory device of this embodiment will be explained with reference to FIGS. 3 and 4. The operations of the input/output circuit of the semiconductor memory device according to this embodiment are similar with those of the input/output circuit of the semiconductor memory device shown in FIG. 1; however, the load controller 500 shown in FIG. 3 is different from the load controller 300 shown in FIG. 1. Accordingly, only an operation of the load controller 500 shown in FIGS. 3 and 4 will be explained below.

The input/output circuit of the semiconductor memory device shown in FIG. 3 is a circuit using the pad 10, which outputs and/or inputs data, and may include a capacitor. In FIG. 4, the first layer 12 of the pad 10 may be a first metal layer used in a manufacturing process of a semiconductor memory device, and the second layer 14 of the pad 10 may be a second metal layer used in a manufacturing process of a semiconductor memory device. Alternatively, the first layer 12 of the pad 10 may be a first metal layer used in a manufacturing process of a semiconductor memory device, and the second layer 14 of the pad 10 may be a polysilicon layer used in a manufacturing process of a semiconductor memory device.

In the input/output circuit of the semiconductor memory device shown in FIG. 3, when the data in the semiconductor memory device are output, the load of the input/output signal line L1 is decreased, and when the data are input from the external devices to the semiconductor memory device, the load of the input/output signal line L1 is increased.

In other words, when the semiconductor memory device receives the data from external devices, integrity of data signals may be improved and waveforms of the data signals may become more clear.

As described above, the input/output circuit of the semiconductor memory device may control the load of the input/output signal line when the data are input from the external devices to the semiconductor memory device and when the data in the semiconductor memory device are output.

Further, the input/output circuit of the semiconductor memory device may improve integrity of data signals.

While the embodiments of the invention and their advantages have been described in detail, it should be understood that various changes, substitutions and alterations may be made herein without departing from the scope of the invention.

What is claimed is:

1. An input/output circuit for a semiconductor memory device, comprising:
a data output circuit configured to buffer output data in the semiconductor memory device in response to an input/output enable signal to output the buffered output data to an input/output signal line;
a data input circuit configured to receive input data from the input/output signal line and buffer the input data to transfer the buffered input data to the semiconductor memory device;
a capacitor coupled to the input/output signal line; and
a load controller configured to couple the capacitor to a power supply in response to the input/output enable signal, the load controller including:
a pad coupled to the input/output signal line; and
a MOS transistor coupled between the pad and the power supply and responsive to the input/output enable signal;
wherein the pad includes:
a first layer coupled to the input/output signal line; and
a second layer coupled to a drain of the MOS transistor.

2. The input/output circuit of claim 1, wherein the data output circuit comprises:
an OR gate configured to perform a logical OR operation on the input/output enable signal and the output data;
an inverter configured to invert the input/output enable signal;
an AND gate configured to perform a logical AND operation on an output signal of the inverter and the output data;
a PMOS transistor having a gate to which an output signal of the OR gate is applied, a source coupled to a high power supply and a drain coupled to the input/output signal line; and
an NMOS transistor having a gate to which an output signal of the AND gate is applied and a drain coupled to the input/output signal line.

3. The input/output circuit of claim 1, wherein the data input circuit comprises:
an inverter;
a PMOS transistor having a gate coupled to the input/output signal line, a source coupled to a high power supply and a drain coupled to an input of the inverter; and
an NMOS transistor having a gate coupled to the gate of the PMOS transistor, a drain coupled to the input of the inverter and a source coupled to a low power supply.

4. The input/output circuit of claim 1, wherein:
the capacitor includes a MOS capacitor having a first terminal coupled to the input/output signal line; and
the load controller includes a MOS transistor coupled between a second terminal of the MOS capacitor and the power supply and responsive to the input/output enable signal.

5. The input/output circuit of claim 4, wherein the power supply is one selected from the group consisting of a low power supply and a high power supply.

6. The input/output circuit of claim 1, wherein the load controller comprises:
an inverter configured to invert the input/output enable signal;
an NMOS capacitor having a first terminal coupled to the input/output signal line;
a PMOS capacitor having a first terminal coupled to the input/output signal line;
an NMOS transistor coupled between a second terminal of the NMOS capacitor and a low power supply and responsive to the input/output enable signal; and
a PMOS transistor coupled between a second terminal of the PMOS capacitor and a high power supply and responsive to an output signal of the inverter.

7. The input/output circuit of claim 1, wherein the power supply is one selected from the group consisting of a low power supply and a high power supply.

8. An input/output method of a semiconductor memory device, the method comprising:
   buffering output data in the semiconductor memory device in response to an input/output enable signal to output the buffered output data to an input/output signal line;
   receiving input data from the input/output signal line and buffering the input data to transfer the buffered input data to the semiconductor memory device; and
   controlling a capacitance of the input/output signal line in response to the input/output enable signal;
   wherein controlling the capacitance of the input/output signal line further comprises increasing a capacitance between the input/output signal line and a low power supply and increasing a capacitance between the input/output signal line and a high power supply in response to the input/output enable signal.

9. The method of claim 8, wherein controlling the capacitance of the input/output signal line further comprises decreasing a capacitance between the input/output signal line and a power supply during a read operation.

10. The method of claim 8, wherein controlling the capacitance of the input/output signal line further comprises increasing the capacitance between the input/output signal line and a power supply during a write operation.

11. An input/output circuit for a semiconductor memory device, comprising:
   a pad;
   a capacitor coupled to the pad; and
   a switching device configured to couple the capacitor to a power supply in response to an input/output enable signal when the input/output enable signal is in one of an input mode and an output mode;
   wherein the pad further comprises:
      a first layer coupled to an input/output signal line; and
      a second layer coupled to the switching device, the first layer and the second layer forming the capacitor.

12. The input/output circuit of claim 11, wherein the capacitor is one selected from the group consisting of an NMOS capacitor and a PMOS capacitor.

13. The input/output circuit of claim 11, further comprising:
   a second capacitor coupled to the pad; and
   a second switching device configured to couple the second capacitor to a second power supply in response to the input/output enable signal.

14. The input/output circuit of claim 11, wherein the switching device is further configured to couple the capacitor to the power supply during a write operation.

15. An input/output circuit for a semiconductor memory device, comprising:
   a data output circuit configured to buffer output data in the semiconductor memory device in response to an input/output enable signal to output the buffered output data to an input/output signal line;
   a data input circuit configured to receive input data from the input/output signal line and buffer the input data to transfer the buffered input data to the semiconductor memory device; and
   a load controller configured to control a load on the input/output signal line in response to the input/output enable signal, the load controller including:
      an inverter configured to invert the input/output enable signal;
      an NMOS capacitor having a first terminal coupled to the input/output signal line;
      a PMOS capacitor having a first terminal coupled to the input/output signal line;
      an NMOS transistor coupled between a second terminal of the NMOS capacitor and a low power supply, and responsive to the input/output enable signal; and
      a PMOS transistor coupled between a second terminal of the PMOS capacitor and a high power supply, and responsive to an output signal of the inverter.

16. An input/output circuit for a semiconductor memory device, comprising:
   a data output circuit configured to buffer output data in the semiconductor memory device in response to an input/output enable signal to output the buffered output data to an input/output signal line;
   a data input circuit configured to receive input data from the input/output signal line and buffer the input data to transfer the buffered input data to the semiconductor memory device; and
   a load controller configured to control a load on the input/output signal line in response to the input/output enable signal, the load controller including:
      a pad coupled to the input/output signal line, the pad including:
         a first layer coupled to the input/output signal line; and
         a second layer coupled to a drain of the MOS transistor; and
      a MOS transistor coupled between the pad and a power supply, and responsive to the input/output enable signal.

17. An input/output method of a semiconductor memory device, the method comprising:
   buffering output data in the semiconductor memory device in response to an input/output enable signal to output the buffered output data to an input/output signal line;
   receiving input data from the input/output signal line and buffering the input data to transfer the buffered input data to the semiconductor memory device; and
   controlling a load of the input/output signal line in response to the input/output enable signal, including increasing the capacitance between the input/output signal line and a low power supply and increasing the capacitance between the input/output signal line and a high power supply in response to the input/output enable signal.

18. An input/output circuit for a semiconductor memory device, comprising:
   a pad;
   a capacitor coupled to the pad;
   a switching device configured to couple the capacitor to a power supply in response to an input/output enable signal;
   a second capacitor coupled to the pad; and
   a second switching device configured to couple the second capacitor to a second power supply in response to the input/output enable signal.

* * * * *